Oct. 29, 1935. H. A. WHEELER Re. 19,744

VOLUME CONTROL

Original Filed July 7, 1927 2 Sheets-Sheet 1

INVENTOR
HAROLD A. WHEELER
BY
Pennie, Davis, Marvin and Edmonds
ATTORNEYS

Oct. 29, 1935. H. A. WHEELER Re. 19,744

VOLUME CONTROL

Original Filed July 7, 1927 2 Sheets-Sheet 2

INVENTOR
HAROLD A. WHEELER
BY
Pennie, Davis, Marvin and Edwards.
ATTORNEYS

Reissued Oct. 29, 1935 Re. 19,744

UNITED STATES PATENT OFFICE 19,744

VOLUME CONTROL

Harold A. Wheeler, Great Neck, N. Y., assignor to Hazeltine Corporation, a corporation of Delaware Original No. 1,879,863, dated September 27, 1932, Serial No. 495,386, which is a division of Serial No. 203,879, July 7, 1927. Application for reissue September 26, 1934, Serial No. 745,651. In Great Britain July 3, 1928

13 Claims. (Cl. 250—20)

This invention relates to amplifiers, and more particularly to amplifiers utilized in modulated carrier-current signaling systems wherein the limit of amplification is automatically maintained substantially at a predetermined level.

This application is a division of application Serial No. 203,879, filed July 7, 1927.

When amplifiers are employed for amplifying a signal voltage it becomes desirable for various reasons to control automatically the amplitude of this amplified signal voltage. To this end the present invention provides means for effecting automatic amplification control. Such an arrangement, for example, is particularly advantageous in radio receivers such as are employed for receiving broadcast signals, because it prevents the overloading of the last amplifier stage of the receiver, which overloading would result in distortion of the reproduced signal, as well as loud and harsh reproduction.

Another advantage resides in uniform reproduction of the amplified signal irrespective of whether the carrier-current signal is received from a nearby station or from a distant or a high-power station, or a low-power station, since it has been found in former radio receivers that when the receiver was reproducing strong signals as from a nearby, or a high-power station, the audibly reproduced signal was very loud, whereas when the signal was received from a distant, or a low-power station, it was relatively weak, with the result that if signals were to be reproduced uniformly from both near and distant stations, and from high-power and low-power stations, it became necessary to readjust some volume controlling means in the receiver to compensate for these unequal signals.

It has also been a common experience in the use of former radio receivers that the reproduced signal was not uniform due to the phenomenon of "fading", whereby the received signal occasionally, or periodically, became much weaker, or faded almost to the point of inaudibility. Since the present invention provides an amplifier which automatically compensates for inequalities in the received carrier-current signal strength, when "fading" takes place the degree of amplification is correspondingly increased and the reproduced signal maintained at its former volume, so that a listener is unaware that variation of the received carrier-current signal is occurring. This automatic compensation for signal fading is especially advantageous in commercial radio telephony and like systems.

A still further advantage is the saving in plate current which is automatically effected during the reception of powerful signals, for the reason that this invention incidentally provides means for reducing the plate current of one or more amplifying tubes as the signal strength increases.

Figure 1:
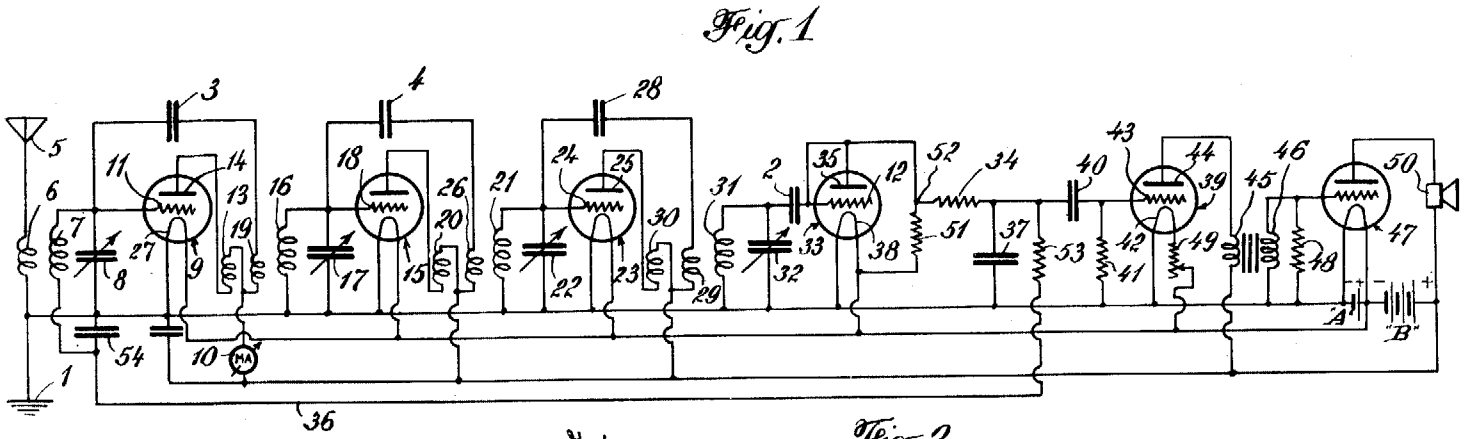
Fig. 1 is a circuit diagram of a complete radio receiver which includes the present invention, and consists of a three-stage radio-frequency amplifier followed by a rectifier, a two-stage audio-frequency amplifier, and a loud speaker, or other suitable indicating device.

Referring in detail to Fig. 1, there is shown an antenna 5 connected to ground 1 through the primary winding 6 of a radio-frequency transformer, the secondary winding 7 of which, tuned by a variable condenser 8, is connected at one point to the filament 27 of the vacuum tube 9 in the first radio-frequency amplifying stage and at another point to the grid 11 of this vacuum tube. The output circuit of this vacuum tube extends from the filament system, through a high-voltage battery "B", a milliammeter 10, primary winding 13 of a second radio-frequency transformer to the anode or plate 14 of this vacuum tube. In order to neutralize the inherent capacity between the grid 11 and the plate 14, and thereby to prevent oscillations, and otherwise to increase the effectiveness of the present invention as hereinafter described, a neutralizing winding 19, electromagnetically coupled to winding 13, and a neutralizing condenser 3 are employed in the manner described in the U. S. patents to Hazeltine Nos. 1,489,228 and 1,533,858.

A second stage of radio-frequency amplification including the vacuum tube 15 neutralized by cooperation of coil 26 and condenser 4, like the first stage, comprises the secondary winding 16 of the last-mentioned radio-frequency transformer tuned by a variable condenser 17 connected between the filament system of the vacuum tube 15 and the grid 18 thereof. The output circuit of this vacuum tube also includes the high-voltage battery "B" and a primary winding 20 of a second radio-frequency transformer, while the secondary winding 21 of this transformer tuned by a variable condenser 22 is included in the input circuit of a third stage of radio-frequency amplification which includes vacuum tube 23. The inherent capacity effective between the electrodes 24 and 25 is neutralized by a network including the neutralizing condenser 28 and the neutralizing winding 29 as described in the mentioned patents. The output circuit of the vacuum tube 23 includes the primary winding 30 of a third radio-frequency transformer and the high-voltage battery "B". The secondary winding 31 of this last-mentioned transformer, tuned by a variable condenser 32, is connected in the input circuit of a rectifier 33 which input circuit includes the fixed condenser 2. The rectifier employed is a two-electrode rectifier which may be of the type commonly known in the art as a "Fleming" valve, or may consist of an equivalent such as a three-electrode vacuum tube, as shown, having its grid 12 and its plate or anode 35 directly connected together to comprise in effect a single anode.

It may here be noted that throughout the present specification and claims the terms "rectifier" and "detector" are, in general, used interchangeably, the terms "rectifying" and "converting" being employed in the general sense to include the process of changing alternating current into a form of direct current or modulated unidirectional current. Likewise, the terms "carrier-current" and "modulation current" may be substituted, respectively, for "radio-frequency current" and "audio-frequency current", since the description herein of radio-frequency amplifiers and audio-frequency amplifiers is merely by way of example of a typical embodiment of the present invention.

In the absence of the present invention including the control circuit 36, to be described, the three-stage tuned radio-frequency amplifier, including the vacuum tubes 9, 15 and 23, functions in a manner well-known in the art to amplify the incoming signal intercepted on the antenna 5. The output circuit of the rectifier 33 includes what may be termed a "rejector" circuit for stopping radio-frequency currents which have passed through the rectifier, and consists of a network including a resistance 34 and a by-pass condenser 37 connected between the anode 35 and the filament 38 of the rectifier. The output circuit of the rectifier is coupled to the input circuit of an audio-frequency amplifying vacuum tube 39 through an audio-frequency-pass filter including a fixed condenser 40 and a resistance 41 connected between the filament 42 and the grid 43 of this vacuum tube. As appears from the constants hereinafter given, the characteristics of this filter are such that it passes the audio-frequency component to the input circuit of the audio or modulation-frequency amplifier, while preventing the unidirectional component from being impressed upon the input circuit thereof. The output circuit of this amplifier is connected between the filament 42 and plate 44 through the high-voltage battery "B" and the primary winding 45 of an audio-frequency transformer, the secondary winding 46 of which is connected in the input circuit of a second audio-frequency tube 47, while a resistance 48 connected across the winding 46 serves to give the audio amplifier substantially uniform amplification over the desired frequency range. Instead of employing resistance 48, a closed copper band of suitable size may be placed around the transformer winding so as to be electromagnetically coupled thereto. A loud speaker or other reproducing device 50, or if required, a coupling device for a telephone system, is connected in the output circuit of the last audio-frequency amplifying tube 47. It is presumed that adequate precautions against undesired electromagnetic coupling between the various radio-frequency coupling transformers are included in all of the arrangements herein disclosed.

In accordance with the main feature of the present invention the degree of amplification effected in the radio-frequency amplifying stages is automatically controlled by a biasing potential obtained by rectifying the modulated signal carrier in a two-electrode rectifier 33, having a resistance 51 connected between the filament 38 and the anode 35 of the rectifier, through which the pulsating rectified or converted current flows, thereby developing a negative voltage at terminal 52. This negative voltage is applied over conductor 36 through the resistance 53 and the secondary winding 7 of the first radio-frequency transformer to grid 11 of the first radio-frequency stage. Resistance 53, together with blocking condenser 54, is effective to filter out and reject any audio-frequency voltages which otherwise might be applied from conductor 36 to the grid 11.

To complete the description of the system illustrated in Fig. 1 certain design data or constants are given herewith. It should be understood, however, that these, as well as all other constants appearing in the present specification, are mentioned merely by way of example in describing certain specific embodiments which in practice have proved eminently satisfactory, and are not intended to suggest any specific limitations as to the scope of this invention. Accordingly, fixed condenser 2 may be of 0.0005 microfarad; 37 of 0.0001 microforad; 54 of 0.01 microfarad; 40 of 0.005 microfarad; resistance 51 of 1 megohm; 34 of 1 megohm; and 41 and 53 of 2 megohms each. The tubes may be assumed to be all of the well-known 201A type.

In the operation of the receiver shown in Fig. 1 a signal intercepted on the antenna 5 is successively amplified through the neutralized tuned radio-frequency stages indicated by the vacuum tubes 9, 15 and 23, connected in cascade. This amplified signal voltage is then rectified by the rectifier 33, and the rectified pulsating current is successively amplified by the audio amplifying stages including vacuum tubes 39 and 47, after which it may be reproduced as sound by the loud speaker 50.

The high resistance 51 connected between the filament 38 and the anode 35 of the rectifier, through which a small space current flows in the absence of signal output from the radio-frequency amplifier, maintains the anode normally negative relative to at least part of the filament of the rectifier. Since all the filaments are connected in parallel, the rectifier filament is maintained at substantially the same potential as the filament 27 of the first radio-frequency amplifier tube 9. Therefore the resistance 51 is connected effectively between the rectifier anode 35 and the amplifier filament 27, and thereby maintains the rectifier anode normally negative relative to at least part of the amplifier filament.

When the rectified or converted signal current (or space current) flowing through the space current circuit including resistance 51 increases with signal output beyond a predetermined value, there is developed at the anode terminal 52 sufficient increase of negative biasing voltage, which in turn is impressed, through the direct-current connection including conductor 36, upon the grid 11 of the vacuum tube 9, to reduce the amplification of this tube. Conversely, it will be apparent that as the magnitude of the rectified current flowing through resistance 51 decreases with decreasing signal strength, the voltage at terminal 52 becomes less negative, and the negative biasing voltage impressed upon the grid 11 also diminishes so that the vacuum tube 9 effects an increased degree of amplification. In this manner, the radio-frequency voltage applied to the input of the rectifier is maintained at a nearly constant predetermined value, and the volume of the reproduced signal is substantially uniform under all conditions. The level at which the volume is maintained uniform is determined by adjustment of rheostat 49 which controls the heating current in the filament 42 of the first audio-frequency amplifying tube 39.

In the above operation it is noted that the two-electrode rectifier 33 functions as the signal detector and also effects rectification of the modulated radio-frequency carrier current to control amplification in the first radio-frequency stage of the receiver. The audio-frequency component of the detector output is transferred to the input circuit of the audio-frequency amplifier for further amplification.

The neutralization of the grid-plate capacity of the radio-frequency amplifying tubes is, in combination with the present invention, particularly valuable in that it allows an increase in the effectiveness of the amplification control, because such neutralization prevents radio-frequency energy from passing through the grid-plate capacity of the tubes. Thus the relay action of the tubes is almost entirely subject to the control by grid bias voltage provided in accordance with this invention.

The time required for operation of the control system would ordinarily be determined by the lowest audio-frequency modulation which must be reproduced. Fading, for example, might be considered a form of modulation; the frequency of the rise and fall of signals due to fading being the frequency of modulation. If this frequency of modulation be increased sufficiently, the effect will be audio-frequency modulation. It will thus be seen that if the automatic control attained by the present invention be allowed to respond too quickly, it will tend to smooth out the desired modulation of the signals at the lower audio frequencies. Hence, a time constant of operation is chosen which will be greater than the period of the audio frequencies which the system is intended to amplify. This time constant of the control circuit is equal to the product of the series resistance and the shunt capacitance of the grid bias circuit, represented in Fig. 1 by resistance 53 between conductor 36 and the anode terminal 52, in the direct-current connection back to the grid 11, and condenser 54 connected between the amplifier filament 27 and a point on conductor 36. Since the time constant can always be reduced to a value equal to the period of the lowest modulation frequency, it may readily be set to meet the requirements of nearly any special case which may arise. For example, a value of two million ohms resistance and of 0.1 microfarad capacitance gives a time constant of one-fifth of a second, which does not appreciably affect the modulation of frequencies above five cycles. While this constant is greater than required from the point of view of satisfactory audio-frequency quality in the reproduction of music, there appears to be no need for more rapid control under the conditions usually encountered. The use in this connection of condensers of large capacitance, such as one-tenth microfarad, likewise introduces another convenience in that the condensers may also serve to by-pass radio frequencies in order to prevent undesired coupling between the detector circuit and the first radio-frequency amplifying tube because of some impedances common to those two portions of the apparatus.

The milliammeter 10 is connected in the anode circuit of the amplifying vacuum tube 9. Upon receipt of an amplified signal at the rectifier, the effect of the control circuit is to decrease the plate current through milliammeter 10, thereby reducing the amplification in the tube 9. When the receiver is tuned to the signal frequency, a minimum amplification is required, so that when the condition of resonance is attained, the plate current of tube 9 is at a minimum value, and the milliammeter 10 so indicates. Thus the milliammeter visually indicates the condition of resonance.

Figure 2:
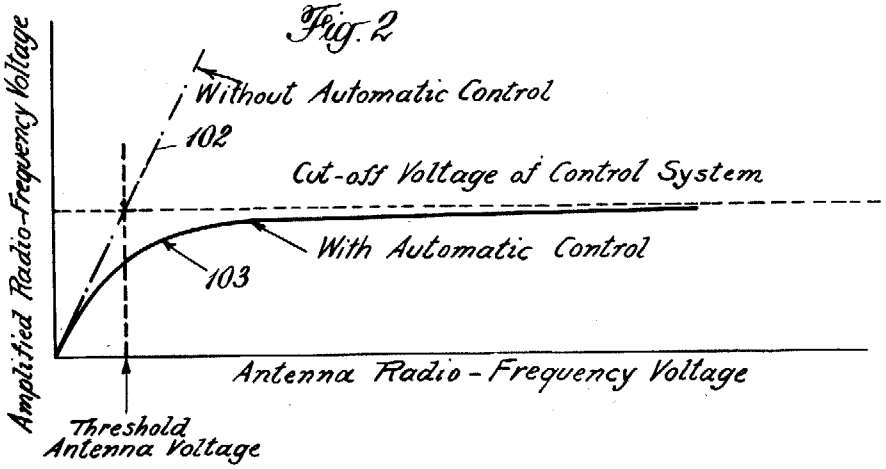
Fig. 2 shows curves disclosing the relation between the radio-frequency antenna voltage and the radio-frequency amplified voltage, with and without the application of the present invention.

For a better understanding of the present invention reference is made to Fig. 2. It will be appreciated that in a system similar to that illustrated in Fig. 1, but in which no means for automatically limiting the degree of amplification is included, the amplified radio-frequency voltage is proportional to the radio-frequency antenna voltage, as indicated by curve 102. When, however, the present invention is employed in such an amplifier, the relation between the radio-frequency antenna voltage and the amplified radio-frequency voltage is indicated by curve 103 from which it will be seen that when at least a certain predetermined radio-frequency antenna voltage is present, (herein referred to as the "threshold antenna voltage") the amplified radio-frequency voltage approaches—but is always less than—another certain predetermined voltage value (herein referred to as the "cut-off voltage").

Figure 3:
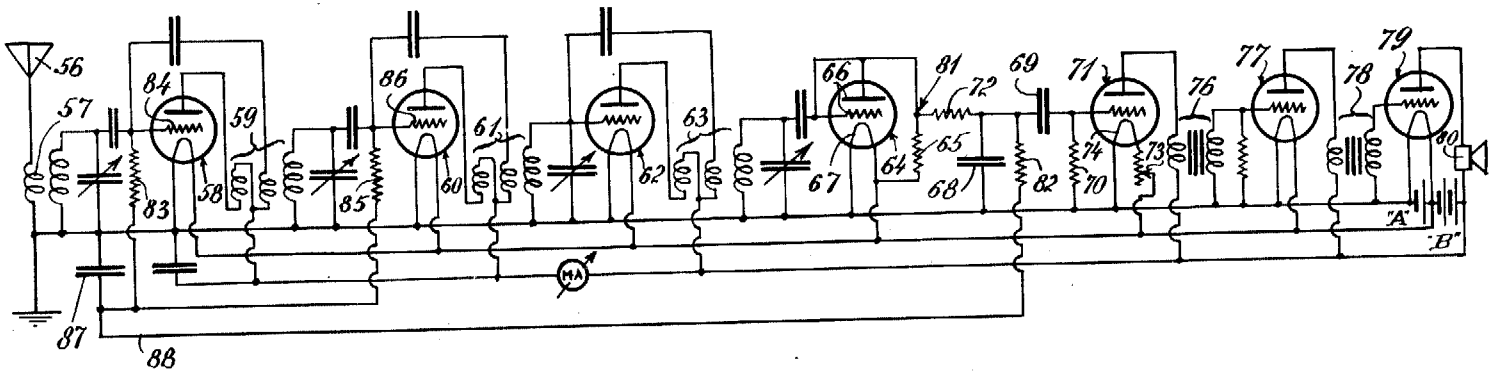
Fig. 3 shows a circuit diagram of a second embodiment of the invention in which there is disclosed a three-stage tuned radio-frequency amplifier, a rectifier, and a three-stage audio-frequency amplifier.

The modification illustrated in Fig. 3 is an especially desirable form of the present invention, and includes antenna 56, connected by means of a transformer 57 to a neutralized three stage tuned radio-frequency cascade amplifier including the vacuum tubes 58, 60 and 62 coupled by transformers 59 and 61. The last stage of the amplifier is connected by a transformer 63 to a two-electrode rectifier 64 of the type already described, the output circuit of which, including the resistance 65, is connected between the anode 66 and filament 67 of the rectifier, as previously explained. Resistance 72 and condenser 68 associated with this output circuit, constitute a "rejector" network which filters out the radio-frequency current component in the output circuit of the rectifier 64, while the network including condenser 69 and resistance 70 constitutes an audio-frequency-pass filter for coupling the output circuit of the rectifier to the input circuit of the audio-frequency amplifier which includes vacuum tube 71. Rheostat 73 controls the heating current supplied to the filament 74 of this vacuum tube, and thereby permits a manual adjustment of the volume of the reproduced signal desired by the listener. Audio-frequency transformer 76, which is preferably of a low ratio of transformation, couples the output circuit of vacuum tube 71 to a second audio-frequency amplifying tube 77. This last vacuume tube in turn is coupled by a second audio-frequency transformer 78 to a third audio-frequency amplifying tube 79 in the output circuit of which there is included a loud speaker 80.

In this arrangement automatic amplification control is effected in a manner slightly different from that shown in the diagram of Fig. 1, since in this instance the radio-frequency voltage of the signals intercepted by the antenna 56 is successively amplified by three neutralized tuned radio-frequency amplifying stages including the vacuum tubes 58, 60 and 62, of which two (instead of one) are controlled in accordance with the present invention. The amplified radio-frequency current is rectified by the rectifying valve 64, and successively amplified at audio-frequency by the vacuum tubes 71, 77 and 79. The rectified current in the output circuit of the rectifier flows through the resistance 65, and thereby develops a negative voltage at the terminal 81, which voltage is applied through the resistances 72, 82, 83 and 85 to the grids 84 and 86 of the radio-frequency amplifying tubes 58 and 60. By thus simultaneously controlling the degree of amplification of two successive radio-frequency amplifying stages a greatly increased uniformity of regulation is attained. Resistance 82 and the condenser 87 constitute an audio-frequency-stop filter, so that substantially only direct-voltage is impressed upon the grids 84 and 86. It will be understood that the voltage developed at terminal 81 is a function of the amplified radio-frequency voltage delivered to the input circuit of the rectifier by the radio-frequency amplifying tubes 58, 60 and 62, and therefore, as the negative voltage at terminal 81 tends to increase with the increased signal, the resulting increase of biasing voltage impressed upon the grids of the tubes 58 and 60 limits the degree of amplification effected in the radio-frequency stages including those tubes.

In this arrangement the constants for the various resistances and condensers may, for example, be the same as those for the corresponding elements in Fig. 1. In addition the grid resistances 83 and 85 may have a value of 2 megohms each; and the grid condensers connected at the junctions of these resistances and the grid electrodes 84 and 86 may each be of 0.001 microfarad capacity.

In Figs. 1 and 3 the variable tuning condensers are grounded in order to eliminate undesirable capacity effects as well as to make it practicable to connect the condensers on a single shaft for uni-control, if desired.

Figure 4:
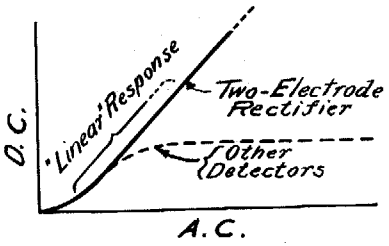
Fig. 4 shows graphically a comparison between the performance of the two-electrode valve or rectifier, and of the three-electrode detector.

There are advantages attending the use, in connection with the present invention, of the two-electrode rectifier circuit typified by Figs. 1 and 3, which may not be apparent from the foregoing discussion. It is impossible to overload this type of rectifier, and the rectified output voltage is directly proportional to the applied alternating signal voltage when this voltage is large, say over two volts. The control system in the circuits of the figures referred to requires a large operating voltage, say ten volts, so that the latter condition of large signal voltage is realized. No such simple relationship is possible in a three-electrode detector, whose rectified output never exceeds a limiting upper value, and is never proportional to the applied voltage, except over a very small range of voltages. This distinction will be seen from Fig. 4 where the abscissæ "A. C." represent the alternating signal voltages, whereas the ordinates "D. C." represent the rectified output voltages. It is well known that the linear curve is much more desirable when minimum distortion of a modulated signal is desired, and it will be observed from Fig. 4 that the preferred type of curve is obtained from the two-electrode rectifier.

If a three-electrode detector were used in an automatic amplification control system, the rectified output voltage would be approximately proportional to the square of the applied voltage, i. e., to the power associated with the applied voltage. For this reason the rectified voltage would increase with the carrier wave modulation. Therefore, if such a detector were so used the total power from the radio-frequency amplifier would be maintained at a substantially constant level, the amplitude of the carrier wave being decreased in the presence of modulation. It is desirable to maintain the carrier wave at a constant amplitude at the output of the amplifier, and this is accomplished by the two-electrode rectifier as shown in Figs. 1 and 3. The control system maintains constant the average signal amplitude which is equal to the carrier wave amplitude and independent of the degree of modulation.

It will be observed that in a system employing a two-electrode rectifier such as represented by tube 33 of Fig. 1, and 64 of Fig. 3, the control bias voltage is independent of the "B" or anode battery voltage. Since the rectifier is not an amplifier, is not critical, and requires neither anode nor biasing battery, no adjusting devices are required. This is not the case in three-electrode detector circuits in which an adjustment must be made, as by a potentiometer, to accommodate the control bias to any particular combination of tubes and "B" voltage.

In the foregoing description, tuned radio-frequency receivers of the neutralized type have been referred to. It should be pointed out, however, that the present invention is generally applicable to radio receivers in wired radio and space radio systems, and that it has been found especially applicable to receivers of the super-heterodyne type.

It is well-known that the common "B" battery may be replaced by a source of rectified and filtered alternating current, and, in the event that tubes having indirectly heated cathodes are used instead of those having incandescent filament cathodes, the common "A" battery may be replaced by a source of alternating current.

For these reasons the present disclosure of typical embodiments of the invention should not be construed as a limitation, but merely as illustrative of the principles of the invention, the scope of which is defined in the appended claims.

What is claimed is:

1. In a signal receiver having a carrier-frequency amplifier which includes at least one vacuum tube having a cathode and a control electrode, a two-electrode rectifier coupled to the output circuit of said amplifier, a high resistance connected between the rectifier anode and the amplifier cathode, means including said resistance for maintaining the average potential of said anode normally negative relative to at least part of said amplifier cathode and increasingly negative with increasing amplified signal output from said amplifier, and a direct-current connection from said anode back to said amplifier control electrode whereby the amplification of said amplifier is regulated automatically.

2. In a carrier-current signaling system, in combination, a vacuum tube amplifier having a cathode and a control electrode, a vacuum tube detector coupled directly to the output of said amplifier, said detector having a cathode and an output electrode, means for maintaining said detector cathode at substantially the same potential as said amplifier cathode, means for maintaining said output electrode at a negative potential with respect to said cathodes, means causing said output electrode to become more negative in the presence of an amplified signal, and a direct-current connection between said output electrode and said control electrode.

3. A combination according to claim 2 in which the means for maintaining the detector output electrode at a negative potential with respect to said cathodes is a resistance connected between said output electrode and the detector cathode.

4. In a modulated-carrier signal receiver having a carrier-frequency amplifier, a two-electrode rectifier coupled to the output circuit of said amplifier, which rectifier produces a modulated unidirectional voltage, a direct-current connection from said rectifier to an element of said amplifier whereby the amplification is regulated automatically, and a connection from said rectifier to a modulation-frequency amplifier whereby the signal is further amplified, said connection from said rectifier to said modulation-frequency amplifier including a condenser in series for preventing the uni-directional component from being impressed upon the input of said modulation-frequency amplifier.

5. In a signaling system, a vacuum tube amplifier having a cathode and a control electrode, a diode detector coupled to said amplifier, said detector having a cathode and an anode, means for maintaining said cathodes at substantially the same potential, means including a high resistance connected between the detector anode and cathode for maintaining said anode normally slightly negative relative to said cathodes, means for causing said anode to become more negative in the presence of an amplified signal, and a direct-current connection between said control electrode and said anode, whereby the amplification of said amplifier is regulated automatically.

6. In a modulated-carrier signal receiver having a carrier-frequency amplifier adapted to amplify modulated signals prior to detection, which amplifier has means for tuning to a desired signal and includes at least one amplifier vacuum tube having a cathode and a control electrode and possessing the property that its amplification decreases with increasingly negative biasing potential on said control electrode relative to the cathode; a system of automatic amplification control which includes a second vacuum tube coupled to the output circuit of the amplifier by means no more selective than the amplifier, said second vacuum tube having an output electrode, means for maintaining the average potential of said output electrode normally slightly negative relative to at least part of said amplifier cathode and increasingly negative with increasing amplified signal output from said amplifier, a direct-current connection from said output electrode back to the amplifier control electrode for impressing thereon a negative biasing potential which varies in accordance with the average potential of said output electrode, whereby the carrier-frequency amplification in said amplifier is substantially decreased automatically with increasing amplified signal output from said amplifier, and a visual indicator coupled to the output circuit of the amplifier and responsive to the relative magnitude of said output, whereby the visual indication follows the strength of the detected signal and thereby facilitates tuning.

7. In a modulated-carrier signal receiver having a carrier-frequency amplifier adapted to amplify modulated signals prior to detection, which amplifier has means for tuning to a desired signal and includes at least one amplifier vacuum tube having a cathode and a control electrode and possessing the property that its amplification decreases with increasingly negative biasing potential on said control electrode relative to the cathode; a system of automatic amplification control which includes a two-electrode rectifier coupled to the output circuit of the amplifier by means no more selective than the amplifier, a high resistance connected between the rectifier anode and said amplifier cathode, means including said resistance for maintaining the average potential of said anode normally negative relative to at least part of said amplifier cathode and increasingly negative with increasing amplified signal output from said amplifier, a direct-current connection from said anode back to said amplifier control electrode for impressing thereon a negative potential which varies in accordance with the average potential of said anode, whereby the carrier-frequency amplification in said amplifier is substantially decreased automatically with increasing amplified signal output from said amplifier, and a visual indicator coupled to the output circuit of the amplifier and responsive to the relative magnitude of said output, whereby the visual indication follows the strength of the detected signal and thereby facilitates tuning.

8. An arrangement according to claim 7 in which said visual indicator is connected in the anode circuit of said amplifier vacuum tube.

9. In a modulated-carrier signal receiver having a carrier-frequency amplifier adapted to amplify modulated signals prior to detection, which amplifier has means for tuning to a desired signal and includes at least one amplifier vacuum tube having a cathode and a control electrode and possessing the property that its amplification decreases with increasingly negative biasing potential on said control electrode relative to the cathode; a system of automatic amplification control which includes a second vacuum tube coupled to the output circuit of the amplifier by means no more selective than the amplifier, said second vacuum tube having an output electrode whose space current circuit includes resistance connected between said output electrode and said amplifier cathode, means including said resistance for maintaining the average potential of said output electrode normally negative relative to at least part of said amplifier cathode and increasingly negative with increasing amplified signal output from said amplifier, a direct-current connection from said output electrode back to said amplifier control electrode for impressing thereon a negative biasing potential which varies in accordance with the average potential of said output electrode, a condenser connected between said amplifier cathode and a point on said direct-current connection, and resistance in said direct-current connection between said point and said output electrode which with said condenser provides a time constant predetermined to filter out voltage fluctuations at frequencies of signal modulation, whereby the carrier-frequency amplification in said amplifier is substantially decreased automatically with increasing amplified signal output from said amplifier and the detected signal strength is automatically controlled irrespective of whether the amplifier is exactly in tune with the signal carrier.

10. In a modulation-carrier signal receiver having a carrier-frequency amplifier adapted to amplify modulated signals prior to detection, which amplifier has means for tuning to a desired signal and includes at least one amplifier vacuum tube having a cathode and a control electrode and possessing the property that its amplification decreases with increasingly negative biasing potential on said control electrode relative to the cathode; a system of automatic amplification control which includes a two-electrode rectifier coupled to the output circuit of the amplifier by means no more selective than the amplifier, a high resistance connected between the rectifier anode and said amplifier cathode, means including said resistance for maintaining the average potential of said anode normally negative relative to at least part of said amplifier cathode and increasingly negative with increasing amplified signal output from said amplifier, a direct-current connection from said anode back to said amplifier control electrode for impressing thereon a negative biasing potential which varies in accordance with the average potential of said anode, a condenser connected between said amplifier cathode and a point on said direct-current connection, and resistance in said direct-current connection between said point and said anode which with said condenser provides a time constant predetermined to filter out voltage fluctuations at frequencies of signal modulation, whereby the carrier-frequency amplification in said amplifier is substantially decreased automatically with increasing amplified signal output from said amplifier and the detected signal strength is automatically controlled irrespective of whether the amplifier is exactly in tune with the signal carrier.

11. In a modulated-carrier signal receiver having a carrier-frequency amplifier which includes at least one amplifier vacuum tube having a cathode and a control electrode and possessing the property that its amplification decreases with increasingly negative biasing potential on said control electrode relative to the cathode; a system of automatic amplification control which includes a two-electrode rectifier coupled to the output circuit of the amplifier, a high resistance connected between the rectifier anode and said amplifier cathode, means including said resistance for maintaining the average potential of said anode normally negative relative to at least part of said amplifier cathode and increasingly negative with increasing amplified signal output from said amplifier, a direct-current connection from said anode back to said amplifier control electrode for impressing thereon a negative biasing potential which varies in accordance with the average potential of said anode, a condenser connected between said amplifier cathode and a point on said direct-current connection, and resistance in said direct-current connection between said point and said anode which with said condenser provides a time constant predetermined to filter out voltage fluctuations at frequencies of signal modulation, whereby the carrier-frequency amplification in said amplifier is substantially decreased automatically with increasing amplified signal output from said amplifier.

12. In a modulated-carrier signal receiver having a carrier-frequency amplifier which includes at least one amplifier vacuum tube having a cathode and a control electrode and possessing the property that its amplification decreases with increasingly negative biasing potential on said control electrode relative to the cathode; a system of automatic amplification control which includes a two-electrode rectifier coupled to the output circuit of the amplifier, means for maintaining the amplifier and rectifier cathodes at substantially the same potential, a high resistance connected between the anode and the cathode of the rectifier, means including said resistance for maintaining the average potential of said anode normally negative relative to at least part of said amplifier cathode and increasingly negative with increasing amplified signal output from said amplifier, a direct-current connection from said anode back to said amplifier control electrode for impressing thereon a negative biasing potential which varies in accordance with the average potential of said anode, a condenser connected between said amplifier cathode and a point on said direct-current connection, and resistance in said direct-current connection between said point and said anode which with said condenser provides a time constant predetermined to filter out voltage fluctuations at frequencies of signal modulation, whereby the carrier-frequency amplification in said amplifier is substantially decreased automatically with increasing amplified signal output from said amplifier.

13. In a modulated-carrier signal receiver having a carrier-frequency amplifier which includes at least one amplifier vacuum tube having a cathode and a control electrode and possessing the property that its amplification decreases with increasingly negative biasing potential on said control electrode relative to the cathode, said receiver also having a modulation-frequency amplifier which is coupled to a signal reproducer; a system of automatic amplification control which includes a two-electrode rectifier coupled to the output circuit of the carrier-frequency amplifier, a high resistance connected between the rectifier anode and said amplifier cathode, means including said resistance for maintaining the average potential of said anode normally negative relative to at least part of said amplifier cathode and increasingly negative with increasing amplified signal output from said carrier-frequency amplifier, a direct-current connection from said anode back to said amplifier control electrode for impressing thereon a negative biasing potential which varies in accordance with the average potential of said anode, a condenser connected between said amplifier cathode and a point on said direct-current connection, resistance in said direct-current connection between said point and said anode which with said condenser provides a time constant predetermined to filter out voltage fluctuations at frequencies of signal modulation, whereby the carrier-frequency amplification is substantially decreased automatically with increasing amplified signal output from said carrier-frequency amplifier, a modulation-frequency connection from said anode to the modulation-frequency amplifier, whereby the rectifier serves also for signal detection, and manually adjustable means for determining the modulation-frequency amplification, whereby the reproduced signal is maintained substantially at any desired volume.

HAROLD A. WHEELER.

DISCLAIMER e. 19,744.—*Harold A. Wheeler*, Great Neck, N. Y. VOLUME CONTROL. Patent dated October 29, 1935. Disclaimer filed October 31, 1941, by the inventor; the assignee, *Hazeltine Corporation*, assenting.

Hereby enters this disclaimer to claims 1 to 7 and 9 to 13 of said patent.

[*Official Gazette November 25, 1941*]